United States Patent [19]

Jalbert

[11] Patent Number: 5,149,986
[45] Date of Patent: Sep. 22, 1992

[54] ELECTRONIC CONTROL BUTTON OPERATED BY SOUND ABSORPTION

[75] Inventor: Vincent P. Jalbert, Middlebury, Conn.

[73] Assignee: Otis Elevator Company, Farmington, Conn.

[21] Appl. No.: 626,390

[22] Filed: Dec. 12, 1990

Related U.S. Application Data

[63] Continuation-in-part of Ser. No. 368,696, Jun. 20, 1989, abandoned.

[51] Int. Cl.⁵ .................. H01H 35/00; H03K 17/94; B66B 3/00; G08B 7/06
[52] U.S. Cl. .................................. 307/117; 187/130; 200/61.01; 340/407; 341/20
[58] Field of Search ............... 187/130, 106; 310/334; 341/30, 24, 20, 21, 23, 27, 34; 181/290; 340/365 R, 407, 825.19, 825.71, 712; 367/93; 73/599, 600, 627, 629; 200/60.01; 361/169.1; 307/112, 113, 115, 116, 117, 125, 132 V

[56] References Cited

U.S. PATENT DOCUMENTS

| | | | |
|---|---|---|---|
| 3,519,105 | 7/1970 | Geil | 187/29 |
| 4,258,356 | 3/1981 | Jalbert | 341/24 |
| 4,378,552 | 3/1983 | Jalbert | 341/30 |
| 4,441,034 | 4/1984 | Iten | 187/105 |

Primary Examiner—Howard L. Williams
Assistant Examiner—Richard Elms
Attorney, Agent, or Firm—William W. Jones

[57] ABSTRACT

An electronic control or touch button, with no moving button parts and operated by sound absorption, including in a first embodiment (FIG. 1) a cylindrical, metal, outer casing (1) of comparable diameter to standard buttons. The casing holds a glass, ball-shaped button (2) serving as a sound transmitting medium, the exposed side of which serves as the button touch surface (3). Behind the ball-shaped button is a printed circuit board (4), carrying on it an integrated circuit (IC; 5), an ultrasound transducer (6), and a series of light emitting diodes (LED; 7). In operation the transducer routinely sends sound (or ultrasound) waves into the glass ball and then receives back the echoes of its transmission—in sonar fashion. If skin or other material comes into contact with the touch surface, some of the sound will be absorbed by the material, and the reduced echoes detected by the IC, which is analyzing the echoes. When the echoes are so reduced (compare upper and lower wave form traces in FIG. 4B), the IC then causes the electrical or electronic function controlled by the touch button to be activated (or deactivated, depending on the design, or otherwise altered). The LEDs then are activated, providing visual feedback to the button pusher. Additionally, tactile and/or audio feedback may be implemented. An exemplary circuit is illustrated in FIG. 3. A second embodiment (FIGS. 2 & 2A) uses a solid metal plate (11) having two button-like-configured depressions (13A & B) surrounded by two, concentric isolation rings (14A/14A & 14B/14B).

24 Claims, 3 Drawing Sheets

ELECTRONIC CONTROL BUTTON OPERATED BY SOUND ABSORPTION

This application is a continuation-in-part of application Ser. No. 368,696, filed Jun. 20, 1989, now abandoned.

DESCRIPTION

1. Technical Field

The present invention relates to touch buttons typically used to activate or deactivate or otherwise affect some electrical or electronic function, when touched typically by a human operator touching or pushing on the button with a finger. The invention more particularly relates to an electronic touch button operated by sound absorption, which can be used in many different applications, including, for example, a push button for elevator car control.

2. Background Art

Most electronic touch buttons rely on body capacitance for activation. However, this approach with its method of detection is lacking at least in the following areas:
- the button is temperature sensitive, resulting in faulty operation;
- the button is relatively highly sensitive to electromagnetic interference (EMI), resulting in more faulty operation;
- the button is relatively sensitive to electrostatic discharge (ESD), resulting in failures;
- there is a lack of any tactile feedback; and
- there are possible electrical shock hazards.

In contrast the present invention avoids these problems by using sound absorption techniques for button activation.

In U.S. Pat. No. 3,519,105 of Geil entitled "Vehicle Control" (issued Jul. 7, 1970), which relates particularly to arrangements for controlling the stopping and starting of elevators at the various floors chosen by passengers due to the action of a push button, an oscillator is used in conjunction with an elevator control system, primarily as a means of encoding rather than on actuation, resulting in a very complex design. In Geil the oscillator's oscillations must be terminated for actuation to occur. When the button is touched there are no oscillations, and there is no sound absorption.

Moreover, in Geil the oscillating element is exposed to the public, making the design very fragile and, it is believed, impractical.

Sound related inventions of the inventor hereof include U.S. Pat. Nos. 4,258,356 entitled "Multi Bar Encoding Apparatus Utilizing Acoustic Energy" (issued Mar. 24, 1981) and 4,378,552 entitled "Acoustic Encoding Apparatus" (issued Mar. 29, 1983), both of which are clearly distinguishable from the present invention.

DISCLOSURE OF INVENTION

The present invention, in contrast to the foregoing, uses sound absorption to activate the corresponding electrical or electronic function as a result of the sound absorption resulting from someone activating or pushing the button.

In essence the present invention uses ultrasound to detect human touch. The human body and most glove materials are good sound absorbers. This sound absorption property is the key element in the invention.

Sound absorption can be measured by a number of techniques, including:
- frequency shift;
- phase shift; and
- various sonar methods.

In the present invention, in contrast to the Geil patent, the oscillating element producing the ultrasound need not be affected for actuation to occur. In the invention, when the button is touched, the sound oscillation continues, because it is the measure of sound (or ultrasound) absorption that causes or triggers the actuation.

To effect this condition, the present invention includes some form of sound transfer medium between the touch surface and the oscillating member (or transducer) generating the sound (or ultrasound). When this medium is in the form of, for example, a steel plate or other metal or suitable plastic, the present invention can produce an extremely rugged button.

In the exemplary embodiments described below, a sonar type implementation is used. In this approach both the number and the size of the echoes produced by a transducer provide a measure of any sound absorption.

Sound absorption is a good method of detection for the following reasons:
- for a resonable amount of absorption to occur a minimum mass and surface force must be applied. This fact rules out false triggers from dust, dirt, flies, etc.; and
- often people will use a variety of different items, such as keys, canes, shoes, etc., to push a button. Most of these items will also absorb sound if they are applied with a reasonable amount of force.

Benefits of the invention include the facts that the button is:
- fire resistant;
- EMI resistant;
- ESD resistant; and is capable of providing both light and tactile and/or audio feedback.

The invention may be practiced in a wide variety of applications, including but certainly not restricted to elevator car control buttons, utilizing known technology, in the light of the teachings of the invention, which are discussed in detail hereafter.

Other features and advantages will be apparent from the specification and claims and from the accompanying drawings, which illustrate two exemplary embodiments of the invention.

BRIEF DESCRIPTION OF DRAWINGS

FIG. 2 is plan view of a second, exemplary embodiment of the invention using a solid metal plate having two button-like-configured depressions serving as the "buttons;" while

BEST MODES FOR CARRYING OUT THE INVENTION

Figure 1:
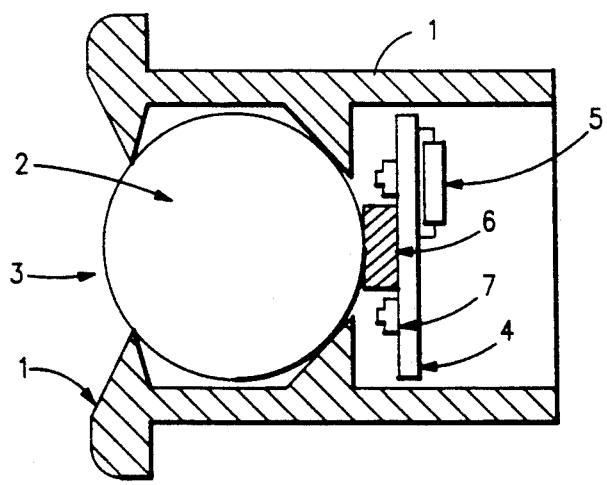
FIG. 1 is a simplified, side, cross-sectional view of a first, exemplary electronic control or touch button incorporating the principles of the present invention. It is noted that the touch button of FIG. 1 is generally cylindrical and basically symmetric about its center-line, except for the details of the printed circuit board 4 and its components 5-7.

As can be seen in FIG. 1, a first exemplary embodiment of the electronic control or touch button, operated by sound absorption in accordance with the principles of the present invention, includes a cylindrical outer casing 1, which can be made of, for example, metal for enhanced strength, and typically would be of the same diameter of other buttons used for the same application. The casing encloses and holds the body and peripheral side areas of a ball-shaped button 2, the exposed side of which serves as the touch surface 3 for the button.

Behind the ball-shaped button 2, which can be made of, for example, glass, is a printed circuit board 4, carrying on it an integrated circuit (IC) 5, an ultrasound transducer 6, and at least one (or a series of) light emitting diode(s) (LED) 7 In operation the transducer 6 routinely sends sound (e.g., ultrasound) waves into the glass ball 2, which serves as a sound transfer medium, and then receives back the echoes of its transmission—in sonar fashion It should be understood herein that the term "sound" is being used in its broader sense and is not restricted to the audible frequencies, and includes, for example, ultrasound waves.

Figure 3:
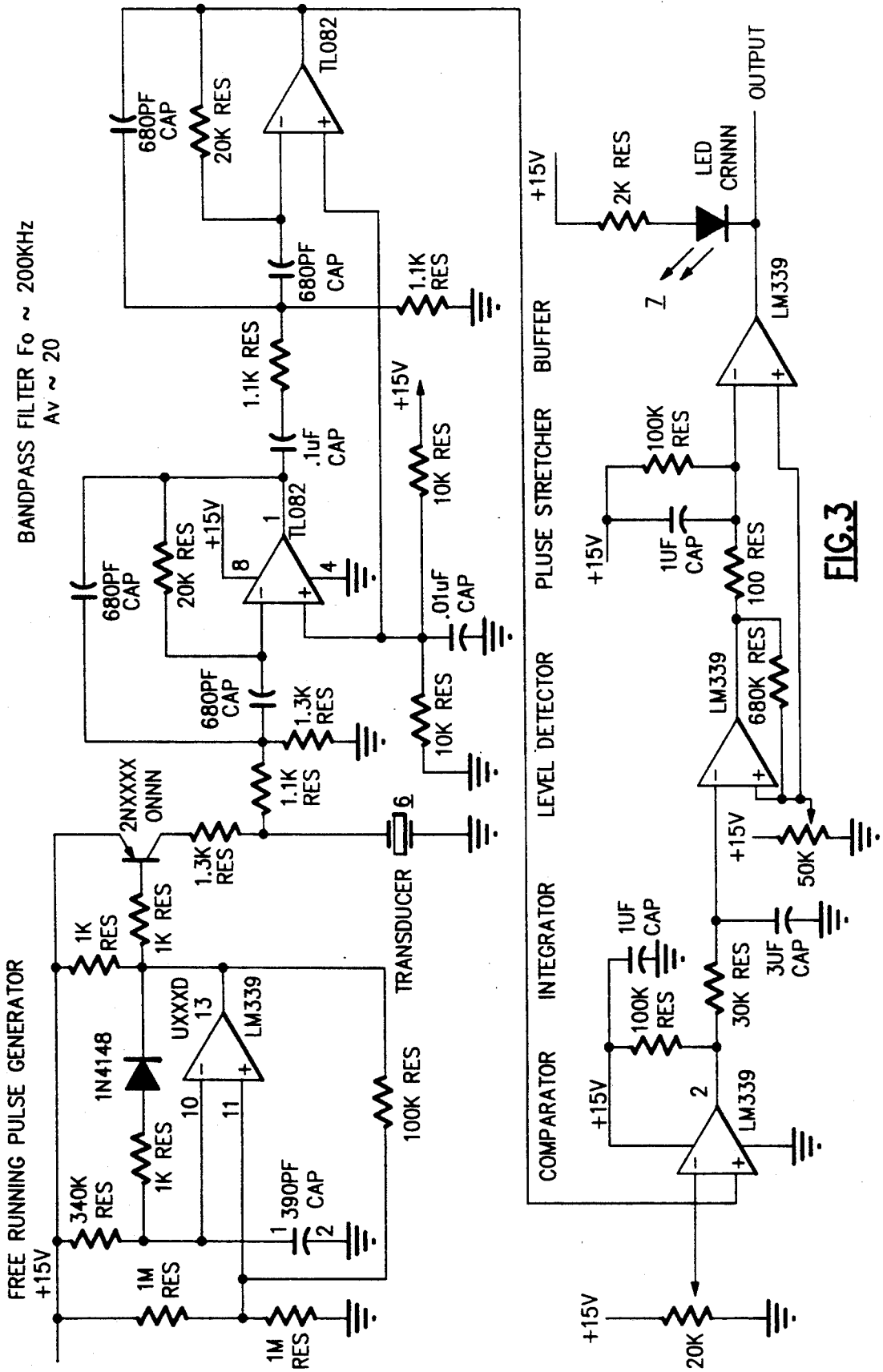
FIG. 3 is a schematic circuit diagram of an exemplary circuit for the "button(s)" of the present invention.

An exemplary transducer for use in the exemplary embodiments hereof is a disc shaped, piezoelectric ceramic transducer from Phillips [catalog No. 4322-020-02270 in their 1986 *Components and Materials* (Book C19); tel. 914/246-2811] made of "PXE 5". An exemplary electronic circuit for the button is illustrated in detail in FIG. 3, with the functional blocks of the circuit titled and the transducer 6 and the LED 7 numbered.

If skin or other material comes in contact with the touch surface 3, some of the sound will be absorbed by the skin or material, and the echoes will, as a result, be reduced. This reduction in echoes is detected by the integrated circuit 5 (detailed in FIG. 3), which is analyzing the echoes by measuring and counting the number of echoes.

Figure 4A:
FIGS. 4A & 4B are comparative oscillographs showing the signals present in the circuit of FIG. 3, with the former comparing the signals produced by the transducer (upper trace) and at the output of the "op amp" (lower trace), and the latter comparing in analogous fashion the echoed signals without anyone touching the button (upper trace) and then with someone touching the button (lower trace).
Figure 4B:
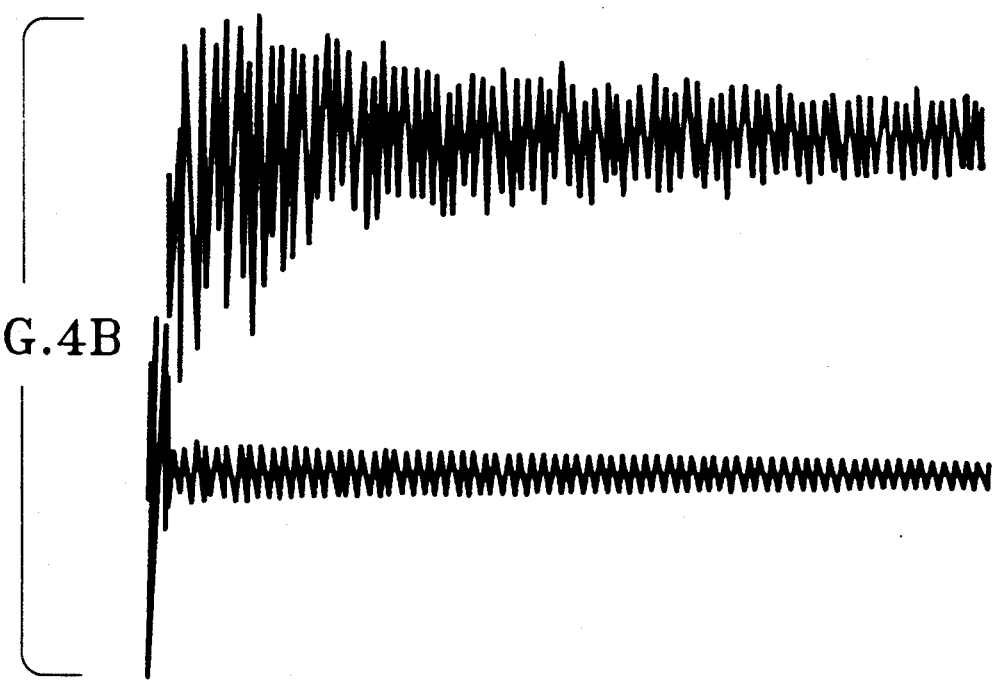

FIGS. 4A & 4B are oscillographs showing exemplary wave form signals which occur in the system. The upper trace of FIG. 4A is of the signal at the transducer 6, while the lower trace is the output signal between ground and pin 7. The upper trace of FIG. 4B is typical in form of the echoed signal, when no one is touching the button surface 3; while the lower trace is typical in comparative form of the echoed signal when some one is touching the button, which, as analogously can be seen, results in a substantial amount of the echoed wave form being absorbed. However, the traces, although analogous to and representative of the echoed signals, are not in fact actual traces taken of echoed signals.

Both sets of oscillographs were taken at room temperature with the "A" axis set at 20 mv/div. and the "B" axis at 2 v/div., with those of FIG. 4A having a time base of 2.5 msecs. and those of FIG. 4B having a time base of 0.1 msecs.

When the echoes are reduced by someone touching the button surface 3, the IC 5 then causes the electrical or electronic function controlled by the touch button to be activated (or deactivated, or altered or otherwise controlled, depending on the design). The electrical function is then affected typically through some controller element connected to the button system at its output.

The IC 5 then also activates (or deactivates, depending on the design) the LEDs 7 providing feedback in the form of light to the button pusher. Additionally, tactile and/or audio feedback may be implemented, if so desired. For tactile feedback the transducer is caused to shift its emitting sound frequencies to an audible one.

The speed of sound in, for example, glass, as well as other materials, is a function of temperature. By measuring the time of "flight", that is, the amount of time between emission and receipt back of the same sound signal, the button can also serve as a heat sensor and fire alarm. Indeed, if the button body or the touch surface got too hot, the device could turn itself "off," preventing use of the button during, for example, fire conditions, which is particularly advantageous for elevator applications.

No movement of the button surface 3 occurs when it is touched or "pushed," although movement can be provided, if so desired.

Because of the low voltage and low amperage characteristics of the components on the printed circuit board 4 and the insulating nature of the glass button, the device will not present an electrical shock hazard. It should also be clear that the device would not be affected by ESD.

Additionally, transducers of the type used in the device are relatively inexpensive and long-lasting.

The material and shape of the touch surface typically is not critical. However, it is at least generally necessary to isolate the touch surface from the frame or casing for the button. In the embodiment illustrated herein, the spherical shape of the button minimizes the surface contact with the frame or casing, having only a peripheral ring contact, and is preferred. However, rather than a completely spherical or ball-like shape, the sound transmitting button element could be in a compound form, having a spherical section at its mounting surface to its casing (1), with the rest of the element having other shapes, such as a circular depression for the touching surface (3) and a flat back end for ease in mounting the electronic components (5-7).

Figure 2:
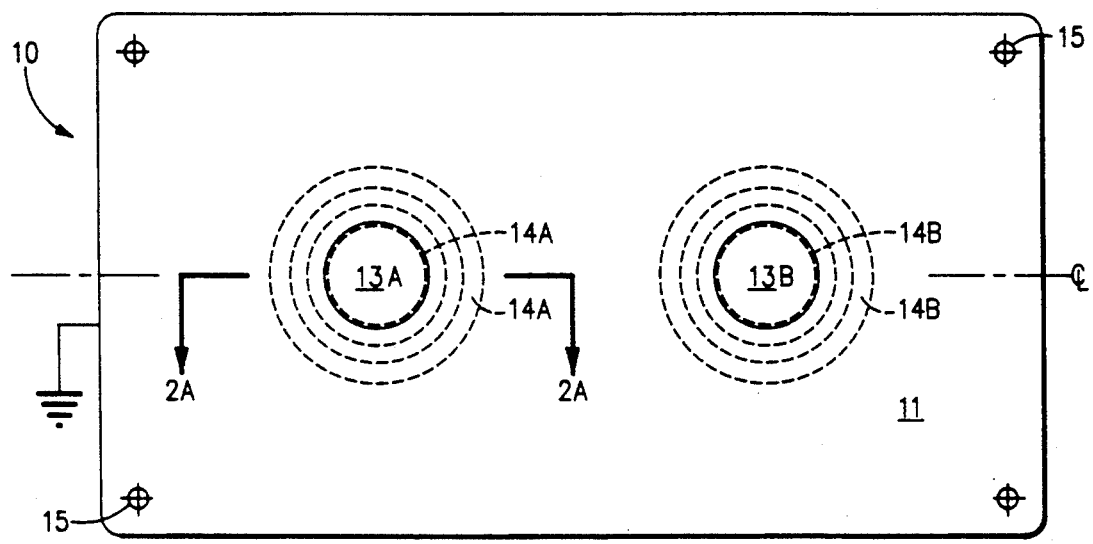
Figure 2A:
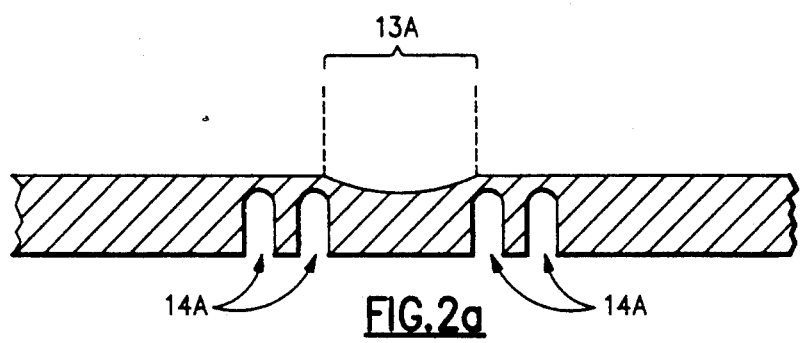
FIG. 2A is a side, cross-sectional, detailed view of the embodiment of FIG. 2 taken along section line 2A—2A of that figure.

However, still many other practical configurations are possible, a further exemplary one being illustrated in FIGS. 2 & 2A. The button system 10 of FIGS. 2 & 2A includes a solid metal plate 11 with no moving parts and having two circular depressions or dimples 13A & 13B serving as the "button" touch surfaces. A transducer (not shown) is preferably located behind each dimple 13A and 13B, along with its associated circuitry, shown with reference to FIG. 1. Four holes 15 are provided at the four corners of the plate 11.

The two buttons can be used as part of an elevator signaling system, with one button serving, for example, as an "up" button and the other as the "down" button for calling an elevator car. In such an elevator application the plate 11 is mounted on the wall adjacent to the elevator, and an awaiting passenger selectively touches one of the button surfaces, signaling the elevator.

Two, concentric, circular channels 14A & 14B encircle the touch button surfaces 13A & 13B, isolating them from the rest of the plate 11. As can be seen in FIG. 2A, the channels 14B extend all the way to and through the back side o plate 11, that is to and through the side of the plate opposite to the button depression 13A. Channels 14A and 14B are preferably filled with a material or compound which absorbs, dissipates and/or dampens the sound waves generated by the transducer. Various materials and compounds will be obvious to those skilled in the art, e.g., solder, various rubber compounds and tar. In the preferred embodiment channels 14A and 14B are filled with lead.

The plate 11, when made of a conductive material, is grounded, as illustrated. It should be clear that the device would not be affected by ESD or EMI.

Exemplary dimensions for the plate button system 10 are outlined below:
Thickness of plate 11 ⅜" (brass)
Diameter of button surface 13A ⅞"
Radius of depth of surface 13A 1¼"
Width of isolation channels 14B ¼"
Distance of center of inner channel 14 from center of button surface 13A 0.5"
Distance of center of outer channel 14B from center of button surface 13A 1.0"

Besides being used as an "on"/"off" or initiating button, the button(s) of the invention could also be used for other purposes, such as for example, as a proportional control.

Although this invention has been shown and described with respect to detailed, exemplary embodiments thereof, it should be understood by those skilled in the art that various changes in form, detail, methodology and/or approach may be made without departing from the spirit and scope of this invention.

Having thus described at least one exemplary embodiment of the invention, that which is new and desired to be secured by Letters Patent is claimed below.

What is claimed is:

1. A method of detecting when a push button surface has been pushed, comprising the following steps:
   sending sound waves through a sound transfer medium which is in sound transferring contact with the push button surface; and
   detecting when a significant amount of the transmitted sound has been absorbed at the button pushing surface by a foreign material, such as the human skin is in contact with the button pushing surface.

2. The method of claim 1, wherein there is included the step(s) of:
   sending a signal to a controller of an electrical function causing the controller to affect the electrical function when the significant amount of sound absorption has been detected.

3. The method of claim 2, wherein there is included the step(s) of:
   generally sending sound waves at ultrasound frequencies but shifting the sound waves being sent to audible ones when the significant amount of sound absorption has been detected, providing tactile feedback in the form of audible sound to one touching the push button surface.

4. A touch button for controlling a function, said touch button comprising:
   a source of sound waves;
   a body having a target area for contact by a user, said body allowing sound waves generated by said sound source to be transmitted therethrough, said body allowing at least a portion of the transmitted sound waves to be reflected back through said body;
   a receiver to sense the reflected sound waves;
   monitoring means operatively connected to said receiver for monitoring the received sound waves and generating a signal to affect the controlled function when a predetermined amount of sound waves are absorbed at said target area, indicating the presence of a user at said target area.

5. The touch button of claim 4, wherein said target area includes an indented portion in said body.

6. The touch button of claim 4, wherein said body is substantially spherical.

7. The touch button of claim 4, wherein said body is substantially a flat plate.

8. The touch button of claim 7, said button further comprising at least one channel about said target area of said flat plate, said at least one channel to substantially isolate said target area from the remaining portion of said plate.

9. The touch button of claim 8, said button further comprising sound dampening material in said at least one channel.

10. The touch button of claim 9, wherein said sound dampening material includes lead.

11. The touch button of claim 7, wherein said target area includes an indented portion in said flat plate.

12. The touch button of claim 11, said button further comprising at least one channel about said indented portion of said flat plate, said at least one channel to substantially isolate said indented portion from the remaining portion of said plate.

13. The touch button of claim 12, said button further comprising sound dampening material in said at least one channel.

14. The touch button of claim 13, wherein said sound dampening material includes lead.

15. The touch button of claim 4, wherein said source and said receiver is a transducer.

16. The touch button of claim 4, said button further comprising feedback to the user, acknowledging the fact that the controlled function has been affected.

17. The touch button of claim 16, wherein said feedback is visual.

18. The touch button of claim 16, wherein said feedback is audio.

19. The touch button of claim 16, wherein said feedback is tactile.

20. A method of controlling a function, said method comprising the steps of:
   transmitting sound waves through a sound transfer medium which allows sound waves to be transmitted therethrough and which allows at least a portion of the transmitted sound waves to be reflected back through the sound transfer medium;
   receiving the reflected sound waves;
   monitoring the reflected sound waves; and
   affecting the controlled function when said monitored sound waves are reduced by a predetermined amount, indicating the presence of a user at said sound transfer medium.

21. The method of claim 20, said method further comprising the step of:
   providing feedback to the user, thereby acknowledging the fact that the controlled function has been affected.

22. The method of claim 21, wherein the step of providing feedback to the user includes providing visual feedback.

23. The method of claim 21, wherein the step of providing feedback to the user includes providing audio feedback.

24. The method of claim 21, wherein the step of providing feedback to the user includes providing tactile feedback.

* * * * *